(12) United States Patent
Helle et al.

(10) Patent No.: US 10,955,509 B2
(45) Date of Patent: Mar. 23, 2021

(54) ARTERIAL SPIN LABELING WITH REDUCED ACOUSTIC NOISE EMISSIONS AND METHOD OF OPERATION THEREOF

(71) Applicant: KONINKLIJKE PHILIPS N.V., Eindhoven (NL)

(72) Inventors: Michael Gunter Helle, Eindhoven (NL); Tim Nielsen, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 1229 days.

(21) Appl. No.: 14/760,845

(22) PCT Filed: Dec. 31, 2013

(86) PCT No.: PCT/IB2013/061432
§ 371 (c)(1),
(2) Date: Jul. 14, 2015

(87) PCT Pub. No.: WO2014/111782
PCT Pub. Date: Jul. 24, 2014

(65) Prior Publication Data
US 2015/0355305 A1     Dec. 10, 2015

Related U.S. Application Data

(60) Provisional application No. 61/752,470, filed on Jan. 15, 2013, provisional application No. 61/806,543, filed on Mar. 29, 2013.

(51) Int. Cl.
*G01V 3/00* (2006.01)
*G01R 33/563* (2006.01)
(Continued)

(52) U.S. Cl.
CPC ... *G01R 33/56366* (2013.01); *G01R 33/3854* (2013.01); *G01R 33/543* (2013.01)

(58) Field of Classification Search
USPC .................. 324/300–322; 600/407–435; 382/128–131
See application file for complete search history.

(56) References Cited

U.S. PATENT DOCUMENTS

| 5,427,102 A | 6/1995 | Shimode et al. |
| 6,564,080 B1 | 5/2003 | Kimura |

(Continued)

OTHER PUBLICATIONS

Helle et al., in the article "Super Selective Pseudo-Continuous Arterial Spin Labeling" from Magnetic Resonance in Medicine vol. 64 pp. 777-786 published in 2010. (Year: 2010).*

(Continued)

*Primary Examiner* — Walter L Lindsay, Jr.

(57) ABSTRACT

A magnetic resonance imaging (MRI) system (100, 600) that generates information indicative of a fluid flow in accordance with a pseudo-continuous arterial spin labeling (pCASL) method. The MRI system may include at least one controller (104, 610) configured to generate a pseudo-continuous arterial spin labeling (pCASL) pulse sequence (200) including at least a first gradient (GR) pulse sequence (207) having a sinusoidal waveform including a plurality of cycles, and a second radio frequency (RF) pulse sequence (205) including a half-wave rectified sinusoidal waveform having a plurality of cycles and which is synchronous with the first GR pulse sequence; label at least part of the fluid flow in a labeling region during a labeling mode using the pCASL pulse sequence; acquire label and control image information of the fluid flow at an imaging region proximal to downstream of the labeling region; and/or generate image information in accordance with a difference of the acquired label and control image information. The sinusoidal gradient waveform results in less acoustic noise during execution of the pulse sequence.

24 Claims, 5 Drawing Sheets

(51) Int. Cl.
  *G01R 33/54* (2006.01)
  *G01R 33/385* (2006.01)

(56) References Cited

U.S. PATENT DOCUMENTS

| | | | |
|---|---|---|---|
| 6,717,405 | B2 | 4/2004 | Alsop |
| 7,242,189 | B2 | 7/2007 | Sugimoto |
| 7,627,360 | B2 | 12/2009 | Kimura |
| 7,898,254 | B2 | 3/2011 | Feinberg et al. |
| 8,195,274 | B2 | 6/2012 | Wong |
| 2010/0240983 | A1 | 9/2010 | Jung et al. |
| 2012/0139537 | A1 | 6/2012 | Holland |
| 2014/0114176 | A1* | 4/2014 | Hirschenbain ... G01R 33/56366 600/411 |
| 2015/0355305 | A1* | 12/2015 | Helle ................ G01R 33/3854 324/309 |

OTHER PUBLICATIONS

Hendrikse et al "Flow Territory Mapping of the Cerebral Arteries With Regiona Perfusion MRI" Downloaded From stroke.ahajournals.org on Jun. 30, 2015.

Helle et al "Superselective Pseudocontinuous Arterial Spin Labeling" Magnetic Resonance in Medicine, 64P. 777-786 (2010).

Detre et al "Tissue Specific Perfusion Imaging Using Arterial Spin Labeling" NMR in Biomedicine vol. 7 p. 75-82 (1994).

Dai et al "Continuous Flow Driven Inversion for Arterial Spin Labeling Using . . . " Magnetic Resonance in Med. vol. 60, p. 1488-1497.

Wu et al, "A Theoretical and Experimental Investigation of the Tagging Efficiency of Pseudocontinuous Arterial Spin Labeling" Magnetic Resonance in Med. vol. 58 p. 1020-1027 (2007).

Helle et al "Silent Pseudo-Continuous Arterial Spin Labeling" Proc. Intl. Soc. Mag. Reson. Med. 21, p. 2152 (2013).

Hennel et al "Silent MRI With Soft Gradient Pulses" Magnetic Resonance in Medicine vol. 42, p. 6-10 (1999).

Van Der Meer "Acoustic Noise Reduction in Pseudo-Continuous Arterial Spin".Magn. Reson. Mater in Phy. Sep. 24, 2013.

Garcia et al "Pseudo-Continuous Flow Driven Adiabatic Inversion for Arterial Spin Labeling" Proc. Intl. Soc. Mag. Reson. Med. 13 p. 37 (2005).

Sokolska et al "Theoretical and Practical Investigation of Acoustic Noise Level Reduction.." Proc. Intl. Soc. Mag. Reson. Med. 21 (2013) p. 2151.

Jahanian et al "Reduced Specific Absorption Rate Pseudo-Continuous Arterial Spin Labeling" Proc . Intl. Soc. Mag. Reson. Med. 18 (2010) p. 1742.

* cited by examiner

ARTERIAL SPIN LABELING WITH REDUCED ACOUSTIC NOISE EMISSIONS AND METHOD OF OPERATION THEREOF

CROSS-REFERENCE TO PRIOR APPLICATIONS

This application is the U.S. National Phase application under 35 U.S.C. § 371 of International Application No. PCT/IB2013/061432, filed on Dec. 31, 2013, which claims the benefit of U.S. Patent Application No. 61/752,470, filed on Jan. 15, 2013 and U.S. Patent Application No. 61/806,543 filed on Mar. 29, 2013. These applications are hereby incorporated by reference herein.

Exemplary embodiments of the present system generally relate to magnetic resonance imaging (MRI) systems and, more particularly, to MRI systems such as those configured to perform arterial spin labeling (ASL) methods with reduced acoustic emissions and and related method of operation thereof.

Magnetic resonance imaging (MRI) methods are widely considered to be a valuable tool in the diagnosis of a variety of cerebrovascular diseases. For example, perfusion imaging based on arterial spin labeling (ASL) methods is an MRI method which may provide images of fluid flow such as blood flow in a test subject such as a human patient in a non-invasive manner. Accordingly, ASL methods may be used to non-invasively assess various blood flow such as intracranial blood flows of patients which may be highly desirable for the correct diagnosis and treatment of patients having an altered vasculature such as described in Hendrikse J, van der Grond J, Lu H, van Zijl P C, Golay X. *Flow Territory Mapping Of The Cerebral Arteries With Regional Perfusion MRI*. Stroke 2004; 35:882-887; and Helle M, Norris D G, Rüfer S, Alfke K, Jansen O, van Osch M J P. *Superselective Pseudocontinuous Arterial Spin Labeling*. Magnetic Resonance in Medicine 2010; 64:777-786, which are incorporated herein by reference as if set out in entirety herein.

Generally, ASL methods utilize arterial blood water spins (hereinafter blood spins) of g blood flow as an endogenous tracer (3) and selectively label blood (e.g., using a labeling pulse sequence which may magnetize or invert the blood water spins) at a labeling region (e.g., a labeling plane) which is proximal to an imaging region. Then images of the labeled blood flow are acquired at the imaging region (or imaging plane or slice) and are generally referred to as label images. More particularly, arterial blood water spins of the blood flow are selectively labeled and, then, after a delay time (e.g., an inflow time ($T_1$)) has elapsed, images of this labeled flow are taken at the imaging region. After labeling, at least part of the labeled blood water spins travel from the labeling region to the imaging region where magnetically labeled spins exchange with tissue water molecules, thereby, reducing overall tissue magnetization. Accordingly, the label images are sensitized to the magnetic difference between labeled spins and nearby static tissue (e.g., cranial tissue).

To obtain a perfusion-weighted signal, a difference of label and control images is determined. Accordingly, a second image acquisition is performed during a control mode (e.g., a control phase) to acquire control images of the blood flow. For the control images, the blood magnetization is ideally not altered (e.g., magnetized or inverted as is done for the label images). Then, subsequent subtraction of corresponding label and control images ideally eliminates static tissue signals and results in a pure perfusion-weighted image. To obtain a sufficient signal-to-noise ratio (SNR), a plurality of pairs of label and control images (usually of the order of between 10 and 30 pairs) are typically sequentially acquired and corresponding difference images determined. Unfortunately, the process of obtaining the plurality of pairs of label and control images may be lengthy with overall scan times of between 3 and 5 minutes.

There are several types of ASL methods that are commonly used and may be classified in accordance with how blood spins are labeled. A common type of ASL method is known as a pseudo-continuous or pulsed-continuous ASL (pCASL) and is typically performed in accordance with a pCASL protocol which employs a pCASL pulse sequence comprising a radio frequency (RF) pulse and gradient pulse pattern (e.g., RF pulse/gradient pattern). This RF pulse/gradient pattern may include a train of short and discrete RF pulses each of about 1 ms length (duration) in conjunction with a synchronously pulsed gradient field. The RF pulse/gradient pattern for example may have parameters such as:

RF pulses: flip angle 18°, RF duration 0.5 ms, time between consecutive RF pulses 0.5 ms; and Gradients: max. amplitude 6 mT/m, mean gradient 0.6 mT/m.

During a labeling mode, the RF pulse/gradient pattern may be repeatedly applied for a duration such as about 2 seconds to create a thin labeling region plane (region) proximal to the imaging slices. Blood spins flowing through this labeling region are inverted (e.g., blood magnetization is inverted) due to a process called flow-driven adiabatic inversion such as described in Garcia, D M., Bazelaire, C D., Alsop, D. *Pseudo-continuous Flow Driven Adiabatic Inversion for Arterial Spin Labeling*. In Proceedings of the Joint Annual Meeting of ISMRM, Miami, USA, 2005, p. 9 (hereinafter, "Garcia"); Wu W C, Fernandez-Seara M, Detre J A, Wehrli F W, Wang J. *A Theoretical And Experimental Investigation Of The Tagging Efficiency Of Pseudocontinuous Arterial Spin Labeling*. Magn Reson Med 2007, 58:1020-1027 (hereinafter, "Wu"); and Dai W, Dairon G, de Bazelaire C, Alsop D C. *Continuous Flow-Driven Inversion For Arterial Spin Labeling Using Pulsed Radio Frequency And Gradient Fields*. Magn Reson Med 2008, 60:1488-1497 (hereinafter, "Dai"), which are incorporated herein by reference as if set out in entirety herein. For sufficient labeling of flowing blood spins, conventional pCASL gradient patterns typically include square or trapezoidal gradient waveforms at frequencies which are in an audible frequency range and which have high gradient strengths and slew rates for sufficient labeling of the flowing blood spins. However, switching of the field gradients to produce these square of trapezoidal field gradient waveforms typically results in mechanical vibrations (e.g., of components of corresponding MRI systems) and resulting acoustic emissions. These acoustic emissions (e.g., acoustic noise) are typically described as clicking or beeping sounds and may exceed 120 dB(A) which may cause discomfort to those exposed such as patients and professionals. Further, with regard to the mechanical vibrations, these vibrations may compromise image quality and may adversely affect component durability (e.g., due to mechanical strain) especially when a repetition time (Tr) of the field gradient waveform is close to a mechanical resonance frequency ($f_{MR}$) of an MRI system. This mechanical strain may lead to premature failure of components of MRI systems which may increase operating cost and downtime. This mechanical vibration should be controlled.

The system(s), device(s), method(s), user interface(s), computer program(s), processes, etc. (hereinafter each of which will be referred to as system, unless the context indicates otherwise), described herein address one or more problems in prior art systems.

The present application describes, inter alia, a novel ASL method and MRI system configured to reduce vibration and noise emissions generated thereby. By reducing vibration mechanical strain upon components of the MRI system, premature failure of components due to stress may be prevented or entirely eliminated which may reduce down time, repairs, and/or operating costs.

In accordance with embodiments of the present system, there is described a magnetic resonance imaging (MRI) system for generating information indicative of a fluid flow, the MRI system comprising at least one controller configured to generate a pseudo-continuous arterial spin labeling (pCASL) pulse sequence including at least a gradient (GR) pulse sequence having a sinusoidal waveform including a plurality of cycles, and a radio frequency (RF) pulse sequence including a waveform having a plurality of cycles and which is synchronous with the GR pulse sequence; label at least part of the fluid flow in a labeling region during a labeling mode using the pCASL pulse sequence; acquire label and control image information of the fluid flow at an imaging region downstream of the labeling region; and generate image information in accordance with a difference of the acquired label and control image information.

It is further envisioned that the sinusoidal waveform of the GR pulse sequence may have one or more of a fixed amplitude and frequency, the RF pulse sequence may include a half-wave rectified sinusoidal waveform, a block waveform, a Hanning waveform, or a sine-modulated Hanning with frequency modulation, waveform, the GR and RF pulse sequences may be synchronized with each other and/or the controller may be configured to label the fluid flow by applying the GR pulse sequence to gradient coils and applying the RF pulse sequence to radio-frequency (RF) transducers. The MRI system may include a display configured to render the generated image information, the controller may be configured to change a frequency of the GR pulse sequence to reduce an acoustic noise output of the MRI system and/or the controller may be configured to select a frequency of the GR pulse sequence set in accordance with one or more acoustical resonance frequencies of the MRI system.

In accordance with embodiments of the present system, there is described a method of generating information indicative of a fluid flow using a magnetic resonance imaging (MRI) system with the method performed by at least one controller of the MRI system. The method includes acts of generating a pseudo-continuous arterial spin labeling (pCASL) pulse sequence including at gradient (GR) pulse sequence having a sinusoidal waveform comprising a plurality of cycles, and a radio frequency (RF) pulse sequence having a plurality of cycles and which is synchronous with the GR pulse sequence; labeling at least part of the fluid flow in a labeling region during a labeling mode using the pCASL pulse sequence; acquiring label and control image information of the fluid flow at an imaging region downstream of the labeling region; and generating image information in accordance with a difference of the acquired label and control image information. The sinusoidal waveform of the first pulse sequence may have one more of a fixed amplitude and frequency. Further, the RF waveform may include a half-wave rectified sinusoidal waveform, a block waveform, a Hanning waveform, or a sine-modulated Hanning with frequency modulation, waveform.

Moreover, in some embodiments, the GR and RF pulse sequences may be synchronized with each other. Labeling the fluid flow may further include one or more acts of applying the GR pulse sequence to gradient coils and applying the RF pulse sequence to radio-frequency (RF) transducers, rendering the generated image information on a display of the MRI system, changing a frequency of the GR pulse sequence to reduce an acoustic noise output of the MRI system, and/or setting a frequency of the GR pulse sequence set in accordance with one or more acoustical resonance frequencies of the MRI system.

In yet other embodiments, there is described a computer program stored on a computer readable memory medium, the computer program configured to generate information indicative of a fluid flow using a magnetic resonance imaging (MRI) system having main coils, gradient coils, and radio frequency (RF) transducers, the computer program including a program portion configured to generate a pseudo-continuous arterial spin labeling (pCASL) pulse sequence including a gradient (GR) pulse sequence having a sinusoidal waveform comprising a plurality of cycles, and a radio frequency (RF) pulse sequence comprising a half-wave rectified sinusoidal waveform having a plurality of cycles and which is synchronous with the GR pulse sequence; label at least part of the fluid flow in a labeling region during a labeling mode using the pCASL pulse sequence; acquire label and control image information of the fluid flow at an imaging region downstream of the labeling region; and generate image information in accordance with a difference of the acquired label and control image information.

It is further envisioned that program portion may be further configured to perform one or more acts including generate the sinusoidal waveform of the GR pulse sequence with one more of a fixed amplitude and frequency, generate the RF pulse sequence to comprise a half-wave rectified sinusoidal waveform, a block waveform, a Hanning waveform, or a sine-modulated Hanning with frequency modulation, waveform. In accordance with embodiments of the present system, the program portion may be further configured to generate the GR and RF pulse sequences synchronized with each other. Moreover, when labeling the fluid flow, the program portion may be further configured to apply the GR pulse sequence to the gradient coils and apply the RF pulse sequence to the RF transducers. In addition, the program portion may be further configured to render the generated image information on a display of the MRI system, change a frequency of the GR pulse sequence to reduce an acoustic noise output of the MRI system, and/or select a frequency of the GR pulse sequence set in accordance with one or more acoustical resonance frequencies of the MRI system.

The invention is explained in further detail, and by way of example, with reference to the accompanying drawings wherein.

The following are descriptions of illustrative embodiments that when taken in conjunction with the following drawings will demonstrate the above noted features and advantages, as well as further ones. In the following description, for purposes of explanation rather than limitation, illustrative details are set forth such as architecture, interfaces, techniques, element attributes, etc. However, it will be apparent to those of ordinary skill in the art that other embodiments that depart from these details would still be understood to be within the scope of the appended claims. Moreover, for the purpose of clarity, detailed descriptions of well known devices, circuits, tools, techniques and methods are omitted so as not to obscure the description of the present system. It should be expressly understood that the drawings are included for illustrative purposes and do not represent the entire scope of the present system. In the accompanying drawings, like reference numbers in different drawings may designate similar elements.

Figure 1:
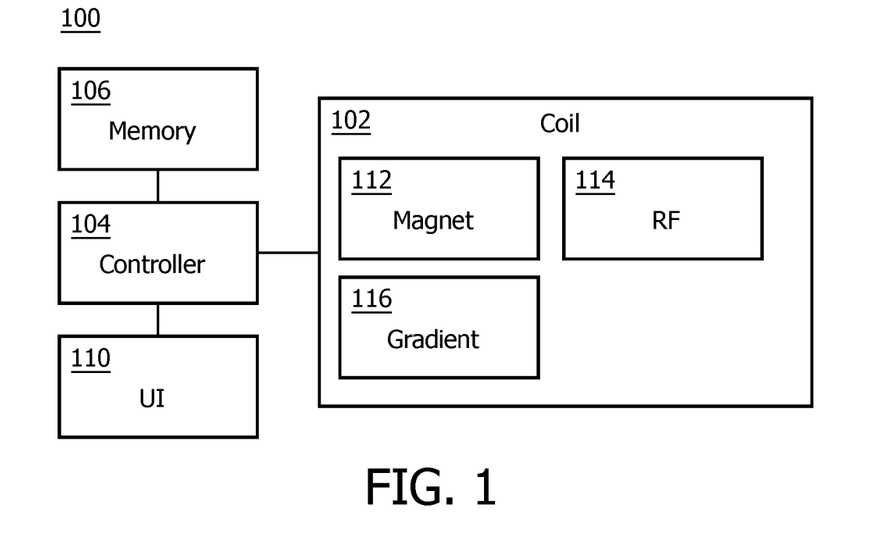
FIG. 1 is a schematic view of a portion of an MRI scanner in accordance with embodiments of the present system.

FIG. 1 is a schematic view of a portion of an MRI scanner 100 in accordance with embodiments of the present system. The MRI scanner 100 may perform one or more types of ASL methods such as pCASL methods, etc., in accordance with embodiments of the present system. The MRI scanner 100 may include one or more of a coil portion 102, a controller 104, a memory 106, and a user interface (UI) 110. One or more of the coil portion 102, the controller 104, the memory 106, and the user interface (UI) 110 may be local and/or remotely located relative to each other and may communicate with each other using wired and/or wireless communication methods. For example, the UI 110 may be remotely located relative to the controller 104 and may communicate with the controller 104 via any suitable communication network (e.g., a telephony network, a 3G or 4G communication network, a local area network (LAN), a wide area network (WAN), the Internet, an intranet, etc.).

The coil portion 102 may include one or more a magnet portion 112, gradient coils 116, and an RF portion 114. The magnet portion 112 may include one or more main coils (e.g., main coils, magnets, DC coils, etc.) which may generate a uniform or substantially uniform magnetic field density in one or more desired areas such as at a scanning volume (e.g., an imaging volume, a region of interest (ROI), a volume of interest (VOI), etc.). The one or more main coils may include superconducting and/or non-superconducting coils which may operate under the control of the controller 104 and may generate a uniform (e.g., homogenous) or substantially uniform magnetic field in at least a portion of the scanning volume. The coil portion 102 may be configured such that the scanning volume may which include label and/or image regions (planes) which may be located internally within an optional interior opening of a body of the coil portion 102 or externally of the body of the coil portion 102.

The controller 104 may control the overall operation of the system 100 and may interface with one or more of the memory 106, the user interface 110, and/or the coil portion 102. The controller 104 may include one or more drivers which may generate one or more signals operative to control (e.g., drive) the coil portion 102. The signals may include, for example, one or more pCASL sequences such as a pCASL sequence in accordance with embodiments of the present system. Accordingly, for example, the pCASL sequence may in include one or more of a sinusoidal signal as a gradient (GR) signal and a selectively pulsed half-rectified sinusoidal signal having two or more cycles (each including a pulse) as a radio-frequency (RF) signal. Each of these signals may have a desired amplitude, frequency, duration, duty cycle, and may be repeated, if desired during a scan time. Accordingly, the controller 104 may include one or more signal generators (e.g., a sine-wave generator), amplifiers rectifiers, pulse generators, filters, etc., to generate these signals. Further, the controller 104 may be operative to transmit RF signal and the GR signal to the coil portion 102 so that they may drive the RF portion 114 and gradient portion 116, respectively, in accordance with embodiments of the present system.

In some embodiments, the controller 104 may include a spin-preparation module to select modes (e.g., label and control modes) and/or an image acquisition module to perform a read-out method for data acquisition. The spin-preparation module and/or the image acquisition module may be operative using in software and/or hardware.

The spin-preparation module may selectively perform one or more labeling and/or control modes. During the labeling mode (e.g., a labeling phase, a selective mode or phase, etc.), the spin preparation module may determine to be operative to label a blood flow using a pCASL sequence in accordance with embodiments of the present system. Further, during a control mode (e.g., a control phase, a non-selective mode or phase, etc.), the spin preparation module may be operative to selectively label blood flow. Accordingly, the spin preparation module may include a selector which may select the label and control modes.

The image acquisition module may be configured to perform a read-out method for data acquisition, e.g., echo-planar imaging or balanced steady-state free precision. Further, presaturation and background suppression pulses may be employed (e.g., using pCASL methods) to suppress static tissue signal in the imaging volume, if desired.

Further, the controller 104 may control location and/or orientation of a platform which may support at least a portion of a test subject to be scanned such as a patient during an MRI scan procedure in accordance with embodiments of the present system. Accordingly, the controller 104 may control location and/or orientation of the platform or portions thereof so that the at least a portion of the test subject may be positioned within the scanning volume during a scan.

The controller 104 may process echo information to acquire images such as control and label images (e.g., using any suitable technique such as a reconstruction technique). Then, the controller may determine a difference of the control and label images and generate a corresponding difference image. This difference image may be rendered on a UI of the system such as a display for the convenience of a user. Further, the controller may store image information related to the label, control, and difference images in a memory of the system such as the memory 106 for later use.

The gradient portion 116 may include one or more gradient coils which may generate one or more gradient fields in one or more axes. For example, the gradient portion 116 may generate Gx, Gy, and Gz fields in x, y, and z axes, respectively.

RF portion 114 may include one or more transceivers for generating an RF transmission and/or receiving signals such as echo information which may be processed by the controller to generate image information (e.g., label and control images) which may then be used to generate a corresponding difference image. It is envisioned that the one or more transceivers may be situated in a transceiver array and may receive information in a parallel and/or sequential manner.

The memory 106 may include any suitable memory for storing application data, operation data, operating parameters, user data, data generated by operation of the present system, and/or as other data related to the described operation of embodiments of the present system. For example, the memory 106 may store operating code, settings, parameters, etc. for performing one or more MRI scanning methods such as ASL methods, a cASL method, etc., in accordance with embodiments of the present system. The memory 106 may include a local memory and/or a distributed memory.

The UI 110 may include any suitable user interface with which a user may interact with the system 100. Accordingly, the UI 110 may include a user input device such as a keyboard, a pointing device, a touch screen, a mouse, a trackball, a microphone, etc. Further, the UI 110 may include any suitable device for rendering information such as a display, a printer, a speaker, etc., for the convenience of a user. Accordingly, MRI image information generated by the present system may be rendered on the display for the convenience of the user in real time. One or more portions of the UI 110 may be located locally and/or remotely from each other. For example, the UI 110 may include a user interface device such as a touchscreen of a mobile station (MS) such as a smart phone (e.g., an IPhone™, etc.), a tablet (e.g., an IPad™, etc.), etc., which may communicate with the controller 104 and may be operative to display information generated by the present system such as the image information and/or receive user inputs such a commands, etc. Accordingly, a user may use a smartphone to interact with the system 100.

The system 100 may experience a mechanical resonance at one or more resonance frequencies $f_{res}$. These resonance frequencies may be stored in a memory of the system and/or determined by the controller 104 using any suitable method.

Figure 2:
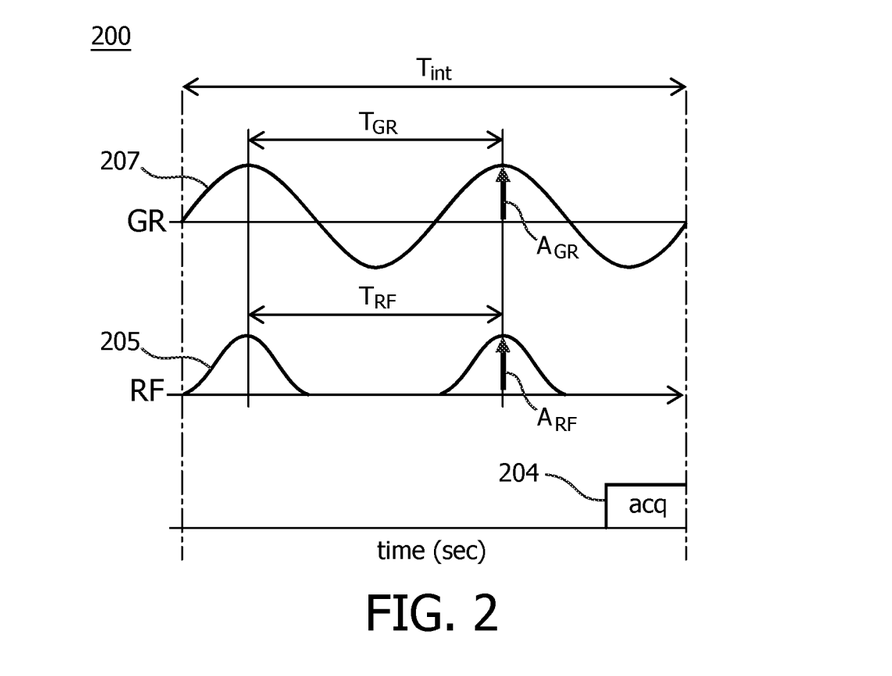
FIG. 2 is a graph illustrating a portion of a pCASL sequence generated in accordance with embodiments of the present system.

FIG. 2 is a graph illustrating a portion of pCASL sequence 100 generated in accordance with embodiments of the present system. The pCASL sequence 100 may include one or more labeling, control and image acquisition 204 sequences which may be performed during labeling, control and image acquisition modes, respectively, which will be discussed below.

Labeling Mode

During the labeling mode, synchronous RF and gradient (GR) signals 205 and 207, respectively, are generated which inverts and blood flow spins flowing through the labeling region due to a process known as adiabatic inversion (e.g., see, Garcia, Wu and Dai). Accordingly, these inverted blood flow spins may be considered to have inverted magnetic fields as opposed to unaltered magnetic fields of blood flow spins subject to processes of a control mode as discussed herein.

With respect to the RF and gradient (GR) signals 205 and 207, respectively, these signals may be output during one or more intervals with each of these one or more intervals having a duration of ($T_{int}$) which may for example be set to about two seconds. However, other values of $T_{int}$ are also envisioned in accordance with embodiments of the present system. The RF and GR signals 205 and 207, respectively, may create a thin labeling region (e.g., a labeling plane) proximal to imaging slices.

The RF signal 205 may include a half-wave rectified sinusoidal waveform with a single frequency ($f_{RF}$), an amplitude ($A_{RF}$), and/or a period ($T_{RF}$) and a phase ($\varphi_{GR}$). In some embodiments, the period $T_{RF}$ may be equal to about 1 msec. Accordingly, for example the frequency $f_{RF}$ (Hz) may be equal to $1/T_{RF}=(1/1 \text{ ms})=1000$ Hz. In accordance with embodiments of the present system, the RF pulses may be adopted in such a way that they meet specific requirements, in case of pCASL, to induce adabatic fast passage inversion of the blood spins flowing through a labeling plane. The frequency of the RF pulse may be determined by the precession frequency of water proton spins in an external magnetic field. However, other values or ranges of values are also envisioned in accordance with embodiments of the present system. The amplitude ($A_{RF}$) may be set to a desired flip angle of an RF pulse such as 18 deg.

The gradient signal GR may have a sinusoidal waveform with a single frequency ($f_{GR}$), an amplitude ($A_{GR}$), a period ($T_{GR}$), and a phase ($\varphi_{GR}$). Thus, the gradient signal may be represented using equation 1 below.

$$A_{GR} \sin(\omega t \varphi_{GR}) \qquad \text{eq. 1}$$

where t is time in seconds and angular frequency $\omega = 2\pi f_{GR}$. One or more of the values the frequency ($f_{GR}$), the amplitude ($A_{GR}$), the period ($T_{GR}$), and/or the phase ($\varphi_{GR}$) may be a constant, if desired. In some systems, the frequency $f_{GR}$ and/or the amplitude $A_{GR}$ may be equal to frequency and/or amplitude, respectively, of gradient signals used in conventional pCASL sequences. Accordingly, a controller of the system may obtain parameters for conventional pCASL sequences and apply these values to corresponding values of a pCASL sequence using sinusoidal and half-wave rectified gradient and RF signals, respectively, in accordance with embodiments of the present system.

Further, with respect to resonance frequencies and values or ranges of value of $f_{GR}$, it is envisioned that in accordance with embodiments of the present system the controller may determine one or more resonance frequencies $f_{res}$ of the MRI system and may select a frequency or frequencies of $f_{GR}$ which are not substantially equal to $f_{res}$ (or multiples thereof, if desired). For example, if it is determined that a mechanical resonance frequency $f_{res}$ of an MRI system is 1000 Hz with a window of +/−25 Hz, the controller may set the frequency $f_{GR}$ of the GR signal 107 equal 950 Hz (e.g., outside of the window). The controller may follow a table lookup and/or equations for setting frequencies of $f_{GR}$ in accordance with determined values of $f_{res}$. The controller may determine $f_{res}$ using any suitable method such as through analysis of feedback information (e.g., acoustic feedback obtained from a microphone and/or acceleration information obtained from one or more accelerometers) obtained from one or more sensors of the system (e.g., in real time) using any suitable analysis method. However, in yet other embodiments, $f_{res}$ may be stored in and/or obtained from a memory of the system.

Control Mode

During the control mode, the blood magnetization is not altered. For example, a gradient signal and an RF signal such as the RF signal 205 may be applied with a phase of consecutive RF pulses switched between 0° and 180° at the labeling region. In this way, the blood flow spins passing through the same region as the labeling region are not inverted. Thus, these blood flow spins have an unaltered (e.g., un-inverted) magnetic fields and may act as control blood flow spins.

Imaging Mode

During the imaging mode the system may obtain label images and corresponding control images after corresponding label and control modes. With regard to signal timing and acquisition, these for example may be the same as those used for conventional ASL sequences. Subsequent subtraction of corresponding label and control images (e.g., using a difference technique, etc.) may reduce or entirely eliminate static tissue signals and results in a pure perfusion-weighted image which may be known as a difference image. To obtain sufficient signal-to-noise ratio (SNR), several pairs of label and control images may be acquired in accordance with embodiments of the present system. For example, 30 pairs of label and control images may be acquired and processed to obtain for example, 15 difference images. The system may then store, process and/or render the difference images on a UI such as a display of the system.

By using a pCASL sequence having a sinusoidal GR signal waveform and/or a half-wave rectified RF signal waveform each with a frequency which does not correspond with a mechanical resonance frequency $f_{res}$ of an MRI system performing the scan, acoustic noise emissions due to mechanical strain may be reduced compared with conventional scanning systems and methods. Further, as vibrations due to the strains are reduced if not entirely eliminated, the quality of acquired images is enhanced.

Figure 3:
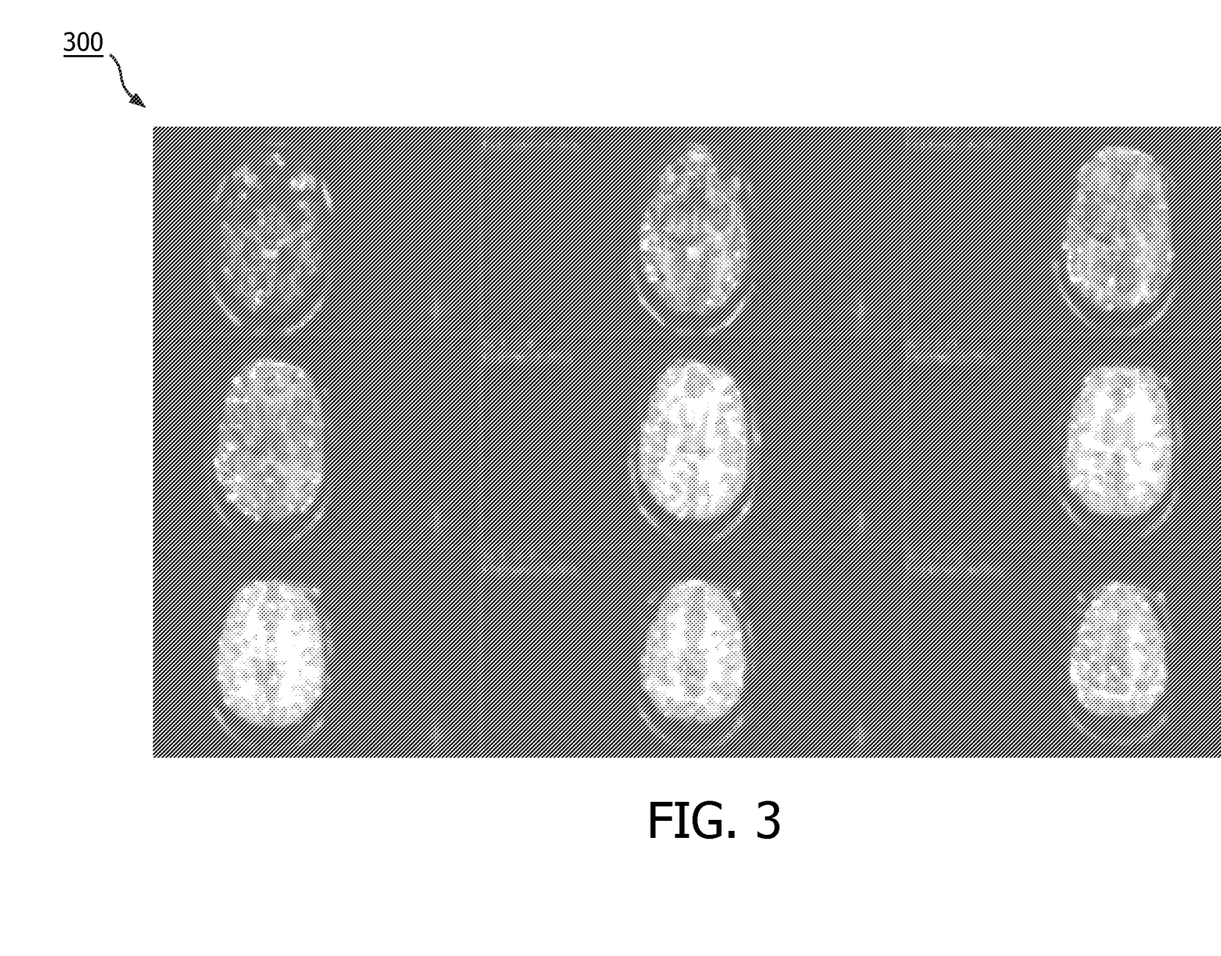
FIG. 3 is an image illustrating an overlay of color coded perfusion signals and anatomical images of a brain of a test subject in accordance with embodiments of the present system.

FIG. 3 is an image 300 illustrating an overlay of color coded perfusion signals and anatomical images of a brain of a test subject in accordance with embodiments of the present system. The images for example may be acquired with a clinical Philips 1.5 T Achieva scanner using the following parameters: field of view 220×220 mm, voxel size of 2.7×2.7×6 mm, gradient echo planar read-out (EPI). Labeling duration 1.65 s, post labeling delay 1.525 s with background suppression, 18 slices and 20 averages of label and control images. Scan time was approximately 2:40 min per measurement. As may be readily appreciated, other values or ranges of values are also envisioned.

Figure 4:
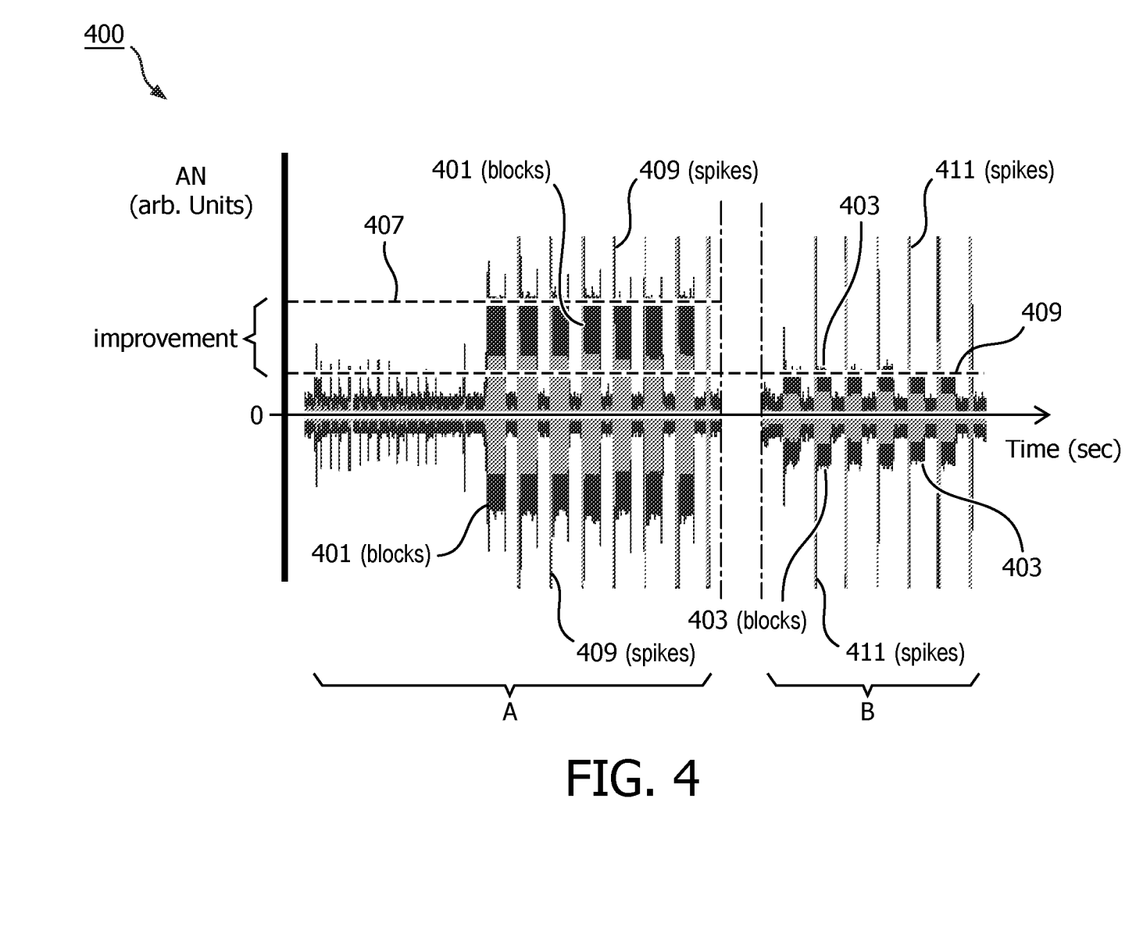
FIG. 4 is a graph illustrating a comparison time trace of acoustic noise emissions of MRI systems operating in accordance with embodiments of the present system and conventional MRI systems.

FIG. 4 is a graph 400 illustrating a comparative time trace of acoustic noise emissions (ANE) of MRI systems operating in accordance with embodiments of the present system and conventional MRI systems. The graph 400 has two time intervals A and B, time interval A illustrates ANE for a conventional pCASL scan and time interval B illustrates ANE for a scan performed in accordance with pCASL methods in accordance with embodiments of the present system. With reference to the time period A, blocks 401 illustrate ANE due to a labeling mode of a conventional square wave pCASL scan and exhibit a relatively steady noise level and peak amplitude as shown by dotted line 407. With reference to time period B, blocks 403 illustrate ANE due to a labeling mode of a pCASL scan in accordance with embodiments of the present system, and exhibit a relatively steady noise level and peak amplitude as shown by dotted line 409. However, as shown by the difference in amplitude between lines 407 and 409, the present system has much lower peak ANE value due to labeling. Further, spikes due to Echo Planar Imaging (EPI) are shown as 409 for conventional scans and 411 for scans in accordance with embodiments of the present system.

Figure 5:
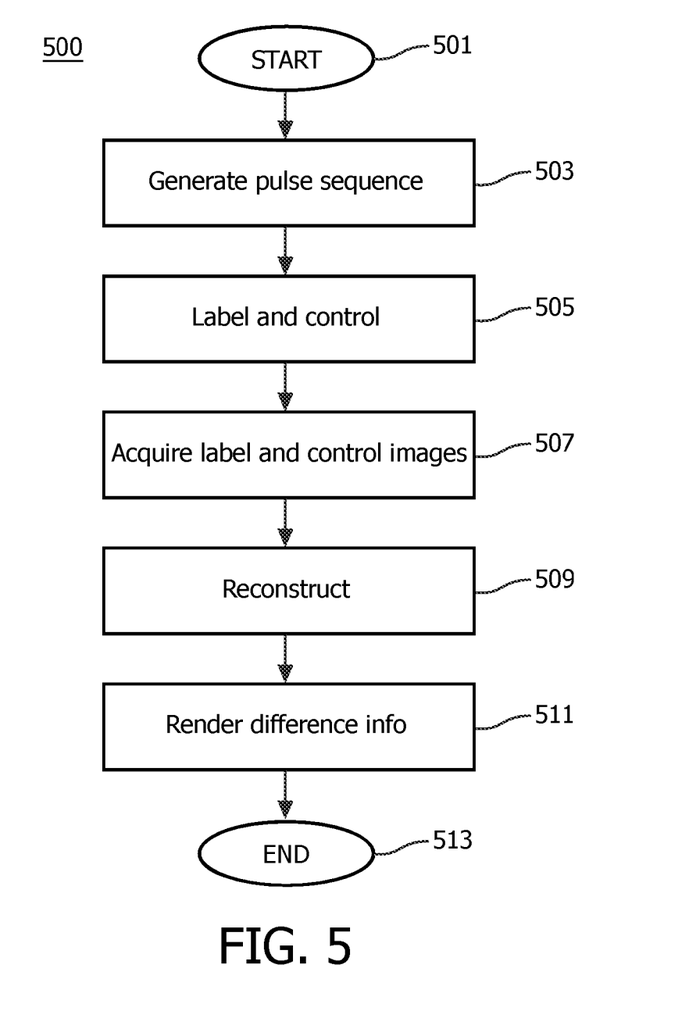
FIG. 5 is a flow diagram that illustrates a process performed by a MRI system in accordance with embodiments of the present system.

FIG. 5 is a flow diagram that illustrates a process 500 performed by a MRI system in accordance with embodiments of the present system. The process 500 may be performed using one or more computers communicating over a network and may obtain information and/or store information using one or more memories which may be local and/or remote from each other. The process 500 may include one of more of the following acts. Further, one or more of these acts may be combined and/or separated into sub-acts, if desired. In operation, the process may start during act 501 and then proceed to act 503. For the sake of clarity, the acts of process 500 illustrate acts for a single labeling and control mode sequence (e.g., 2 seconds) as shown. However, certain acts of process 500 may be repeated, if desired during the course of a full scan interval (e.g., 3 minutes, etc)

During act 503, the process may generate a pCASL pulse sequence including at least a gradient pulse sequence having a sinusoidal waveform including a plurality of cycles, and an RF pulse sequence having a half-rectified sinusoidal waveform having a plurality of cycles and which is synchronous with the first pulse sequence. The gradient pulse sequence may include a signal waveform which is be similar to the GR signal (e.g., see GR 207) and the RF pulse sequence may include a signal waveform which is similar to the RF signal (e.g., see, 205) discussed above. After completing act 503, the process may continue to act 505.

During act 505, the process may selectively perform label and control modes. During the label mode, the process may selectively label at least part of the fluid flow in a labeling region during a labeling mode (e.g., a labeling phase) using the pCASL pulse sequence formed during act 503. Accordingly, the RF pulse sequence may be applied to RF transducers of the system and the GR pulse sequence may be applied to the gradient coils. The RF pulses may act to invert (e.g., magnetize) blood spins flowing through the labeling region. This inversion may be performed in accordance with a flow-driven adiabatic inversion process. However, other inversion processes are also envisioned. Accordingly, during the labeling sequence, the blood magnetization may be inverted and during the control mode, the process generally does not alter the blood magnetization. During the control mode, the process typically does not alter the blood magnetization.

To select the modes, the process may use a spin preparation module which may be configured to determine when to select a control mode and when to select a label mode. After completing act 505, the process may continue to act 507.

During act 507, the process may acquire label and control image information of the fluid flow at an imaging region proximal to the labeling region corresponding to label and control images, respectively. The acquisition of the label image information may be performed some time after the blood flow spin is labeled at the labeling region. This time may be known as a label delay time ($T_1$) and may be selected so that at least part of the labeled blood flow spin has sufficient time to enter the imaging region. For example, in some embodiments the label delay time $T_1$ may begin to count immediately after a blood flow spin is labeled. Similarly, the acquisition of control image information may occur after a control delay time (e.g., T2, etc.) has elapsed. For example, in some embodiments, the control delay time may begin to count after a corresponding control sequence has ended. However, in yet other embodiments other timing methods may be used to determine when to acquire label and/or control image information.

One or more sensors (e.g., transducers, receivers, etc.) of the RF portion may acquire the label and/or control image information using any suitable read-out method for data acquisition. For example, echo-planar imaging (EPI) or balanced steady-state free precision methods may be used to acquire the label and/or control image information. Further, the system may use presaturation and/or background suppression pulses to suppress static tissue signals in the imaging region. The label and/or control image information may be acquired in accordance with one or more ASL methods such as one or more pCASL methods operating in accordance with one or more methods of the present system. For example, sensors of the RF portion may detect echo information and convert the echo information into corresponding label or control image information. After completing act 507, the process may continue to act 509.

During act 509, the process may reconstruct a difference image based upon a difference of corresponding pairs of label and control images acquired during act 507. The process may store the difference image information as well as the label and control image information in a memory of the system for later use, if desired. After completing act 509, the process may continue to act 511.

During act 511, the process may render the difference image on an output device such as a display of the system. The difference image may be output as a still image and/or as video information in real time, if desired. After completing act 511, the process may continue to act 513 where it may end or may continue with a repetition of one or more of the prior acts (e.g., such as a further sequence of acts).

Figure 6:
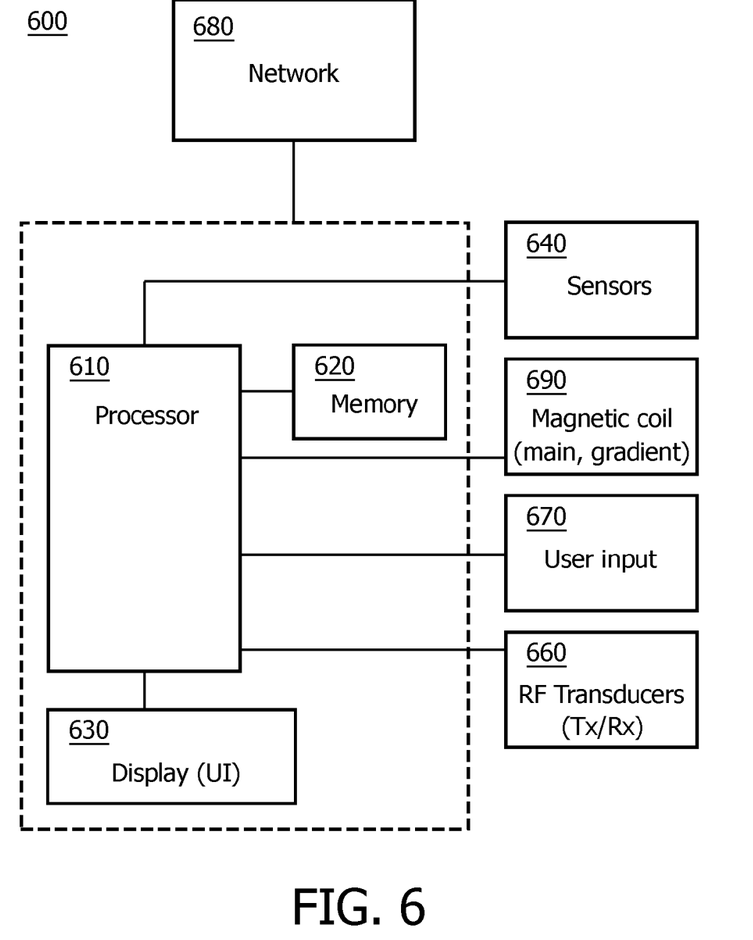
FIG. 6 shows a portion of a system in accordance with embodiments of the present system.

FIG. 6 shows a portion of a system 600 (e.g., an MRI system, etc.) in accordance with embodiments of the present system. For example, a portion of the present system may include a processor 610 (e.g., a controller) operationally coupled to a memory 620, a display 630, sensors 640, RF transducers 660, magnetic coils 690, and a user input device 670. The memory 620 may be any type of device for storing application data as well as other data related to the described operation. The application data and other data are received by the processor 610 for configuring (e.g., programming) the processor 610 to perform operation acts in accordance with the present system. The processor 610 so configured becomes a special purpose machine particularly suited for performing in accordance with embodiments of the present system.

The operation acts may include configuring an MRI system by, for example, controlling one or more of the gradient coils, the RF transducers 660 to output one or more desired signals so as to form control and label signals. The magnetic coils 690 may include main magnetic coils (e.g., main magnets, DC coils, etc.), and the gradient coils (e.g., x-, y-, and z-gradient coils) and may be controlled to emit a main magnetic field and/or gradient fields in one or more desired directions and/or magnitudes (power). The processor 610 may control one or more drivers to drive to the magnetic coils 690 so that a desired magnetic field is emitted at a desired time. The RF transducers 660 may be controlled to transmit RF pulses at the test subject and/or to receive information such as MRI (echo) information therefrom. A reconstructor (e.g., processor 610) may process detected information such as the echo information and transform the detected echo information into content which may include image information (e.g., still or video images (e.g., video information)), data, and/or graphs that may be rendered on, for example, a user interface (UI) of the present system such as on the display 630, a speaker, etc. Further, the information may then be stored in a memory of the system such as the memory 620 for later use. Thus, operation acts may include requesting, providing, and/or rendering of information such as, for example, reconstructed image information obtained from the echo information. The processor 610 may render the information on a UI of the system such as a display of the system. For example, the reconstructor may obtain label image and control image information (e.g., from RF transducers) and may then determine a difference between the label and control image information to obtain the image information based upon this difference which may be included in the content. Thus, the reconstructor may use any suitable image processing methods (e.g., digital signal processing (DSP), algorithms, echo-planar imaging methods, balanced steady-state free precision methods, etc. to process the control and/or label image information to obtain the content.

The sensors 640 may include a microphone (e.g., acoustic sensors), accelerometers, magnetic coils, etc. and may provide corresponding feedback information to the processor 610 for further processing to, for example, determine whether there is a mechanical resonance in the system and at what frequency the mechanical resonance is occurring.

The user input 670 may include a keyboard, a mouse, a trackball, or other device, such as a touch-sensitive display, which may be stand alone or be a part of a system, such as part of an MRI system, a personal computer, a personal digital assistant (PDA), a mobile phone, a monitor, a smart- or dumb-terminal or other device for communicating with the processor 610 via any operable link. The user input device 670 may be operable for interacting with the processor 610 including enabling interaction within a UI as described herein. Clearly the processor 610, the memory 620, display 630, and/or user input device 670 may all or partly be a portion of a computer system or other device such as an MRI system and/or server of such a system.

The methods of the present system are particularly suited to be carried out by a computer software program, such program containing modules corresponding to one or more of the individual steps or acts described and/or envisioned by the present system. Such program may of course be embodied in a computer-readable medium, such as an integrated chip, a peripheral device or memory, such as the memory 620 or other memory coupled to the processor 610.

The program and/or program portions contained in the memory 620 configure the processor 610 to implement the methods, operational acts, and functions disclosed herein. The memories may be distributed and/or local, and the processor 610, where additional processors may be provided, may also be distributed or may be singular. The memories may be implemented as electrical, magnetic or optical memory, or any combination of these or other types of storage devices. Moreover, the term "memory" should be construed broadly enough to encompass any information able to be read from or written to an address in an addressable space accessible by the processor 610. With this definition, information accessible through a network is still within the memory, for instance, because the processor 610 may retrieve the information from the network for operation in accordance with the present system.

The processor 610 is operable for providing control signals and/or performing operations in response to input signals from the user input device 670 as well as in response to other devices of a network and executing instructions stored in the memory 620. For example, the processors 610 may obtain feedback information from the sensors 640, may determine whether there is a mechanical resonance. The processor 610 may include one or more of a microprocessor, an application-specific or general-use integrated circuit(s), a logic device, etc. Further, the processor 610 may be a dedicated processor for performing in accordance with the present system or may be a general-purpose processor wherein only one of many functions operates for performing in accordance with the present system. The processor 610 may operate utilizing a program portion, multiple program segments, and/or may be a hardware device utilizing a dedicated or multi-purpose integrated circuit.

Further variations of the present system would readily occur to a person of ordinary skill in the art and are encompassed by the following claims. Further, applications of the present invention, include, but are in no way limited to, e.g., non-selective and selective perfusion measurements of fluids in cranial regions using pCASL type imaging methods. Exemplary embodiments of the present invention may image fluid in other regions or areas of a test subject such as a cardiac fluid (e.g., in cardiac area, etc.), abdominal fluid (e.g., in an abdominal area, etc.), etc. The non-selective perfusion methods may include ASL sequences that label the blood of all arteries within a labeling volume and/or which cross the labeling plane; and the selective perfusion methods may be configured to label the blood in an individual artery.

Finally, the above-discussion is intended to be merely illustrative of the present system and should not be construed as limiting the appended claims to any particular embodiment or group of embodiments. Thus, while the present system has been described with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise;

h) no specific sequence of acts or steps is intended to be required unless specifically indicated; and i) the term "plurality of" an element includes two or more of the claimed element, and does not imply any particular range of number of elements; that is, a plurality of elements may be as few as two elements, and may include an immeasurable number of elements.

What is claimed is:

1. A magnetic resonance imaging system for generating information indicative of a fluid flow, the magnetic resonance imaging system comprising at least one controller configured to:

determine one or more mechanical, acoustical resonance frequencies of the magnetic resonance imaging system;

determine a pseudo-continuous arterial spin labeling pulse sequence based on the one or more mechanical, acoustical resonance frequencies of the magnetic resonance imaging system, the pseudo-continuous arterial spin labeling pulse sequence comprising at least a gradient pulse sequence having a sinusoidal waveform comprising a plurality of cycles, and a radio frequency pulse sequence comprising a waveform having a plurality of cycles and which is synchronous with the gradient pulse sequence, wherein the sinusoidal waveform of the gradient pulse sequence has a fixed frequency determined based on the one or more mechanical, acoustical resonance frequencies of the magnetic resonance imaging system;

generate the pseudo-continuous arterial spin labeling pulse sequence;

label at least part of the fluid flow in a labeling region during a labeling mode using the pseudo-continuous arterial spin labeling pulse sequence;

acquire label and control image information of the fluid flow at an imaging region downstream of the labeling region; and generate image information in accordance with a difference of the acquired label and control image information.

2. The magnetic resonance imaging system of claim 1, wherein the sinusoidal waveform of the gradient pulse sequence has a fixed amplitude.

3. The magnetic resonance imaging system of claim 1, wherein the radio frequency pulse sequence comprises at least one of a half-wave rectified sinusoidal waveform, a block waveform, a Hanning waveform, or a sine-modulated Hanning with frequency modulation, waveform.

4. The magnetic resonance imaging system of claim 1, wherein a phase of consecutive radio frequency pulse sequences is switched between 0° and 180°.

5. The magnetic resonance imaging system of claim 1, wherein the controller is further configured to determine the pseudo-continuous arterial pulse sequence based on at least one of a table lookup and equations for setting frequencies of the gradient pulse sequence in accordance with the one or more mechanical, acoustical resonance frequencies of the magnetic resonance imaging system.

6. The magnetic resonance imaging system of claim 1, further comprising a display configured to render the generated image information.

7. The magnetic resonance imaging system of claim 1, wherein the controller is configured to change a phase of consecutive radio frequency pulse sequences between 0° and 180°.

8. The magnetic resonance imaging system of claim 1, wherein the controller is configured to select the fixed frequency of the sinusoidal waveform of the gradient pulse sequence so that it is not substantially equal to the determined one or more mechanical, acoustical resonance frequencies of the magnetic resonance imaging system.

9. A method of generating information indicative of a fluid flow using a magnetic resonance imaging system, the method performed by at least one computer controller of the magnetic resonance imaging system and comprising:

determining one or more acoustical resonance frequencies of the magnetic resonance imaging system;

determining a pseudo-continuous arterial spin labeling (pCASL) pulse sequence based on the one or more acoustical resonance frequencies of the magnetic resonance imaging system, the pCASL pulse sequence comprising:

a gradient pulse sequence having a sinusoidal waveform comprising a plurality of cycles wherein the sinusoidal waveform has a fixed frequency determined based on the one or more acoustical resonance frequencies of the magnetic resonance imaging system, and a radio frequency pulse sequence comprising a waveform having a plurality of cycles and which is synchronous with the gradient pulse sequence;

generating the pseudo-continuous arterial spin labeling pulse sequence;

labeling at least part of the fluid flow in a labeling region during a labeling mode using the pseudo-continuous arterial spin labeling pulse sequence;

acquiring label and control image information of the fluid flow at an imaging region downstream of the labeling region; and generating image information in accordance with a difference of the acquired label and control image information.

10. The method of claim 9, where the sinusoidal waveform of the gradient pulse sequence has a fixed amplitude.

11. The method of claim 9, wherein the radio frequency waveform comprises at least one of a half-wave rectified sinusoidal waveform, a block waveform, a Hanning waveform, or a sine-modulated Hanning with frequency modulation, waveform.

12. The method of claim 9, wherein a phase of consecutive radio frequency pulse sequences is switched between 0° and 180°.

13. The method of claim 9, wherein the act of determining the pseudo-continuous arterial spin labeling pulse sequence comprises an act of utilizing at least one of a table lookup and equations for setting frequencies of the gradient pulse sequence in accordance with the one or more acoustical resonance frequencies of the magnetic resonance imaging system.

14. The method of claim 9, further comprising an act of rendering the generated image information on a display of the magnetic resonance imaging system.

15. The method of claim 9, further comprising an act of changing a phase of consecutive radio frequency pulse sequences.

16. The method of claim 9, further comprising an act of setting the fixed frequency of the sinusoidal waveform of the gradient pulse sequence so that it is not substantially equal to the one or more acoustical resonance frequencies of the magnetic resonance imaging system.

17. A non-transitory computer readable memory medium storing a computer program configured to generate information indicative of a fluid flow using at least one of a magnetic resonance imaging system having main coils, gradient coils, and radio frequency transducers, the computer program comprising:

a program portion configured to:
  determine one or more acoustical resonance frequencies of the magnetic resonance imaging system;
  determine a pseudo-continuous arterial spin labeling pulse sequence based on the one or more acoustical resonance frequencies of the magnetic resonance imaging system, the pseudo-continuous arterial spin labeling pulse sequence comprising:
    a gradient pulse sequence having a sinusoidal waveform comprising a plurality of cycles, wherein the sinusoidal waveform has a fixed frequency determined based on the one or more acoustical resonance frequencies of the magnetic resonance imaging system, and
    a radio frequency pulse sequence comprising a half-wave rectified sinusoidal waveform having a plurality of cycles and which is synchronous with the gradient pulse sequence;
  generate the pseudo-continuous arterial spin labeling pulse sequence;
  label at least part of the fluid flow in a labeling region during a labeling mode using the pseudo-continuous arterial spin labeling pulse sequence;
  acquire label and control image information of the fluid flow at an imaging region downsteam of the labeling region; and
  generate image information in accordance with a difference of the acquired label and control image information.

18. The non-transitory computer readable memory medium of claim 17, wherein the program portion is further configured to generate the sinusoidal waveform of the gradient pulse sequence with a fixed amplitude.

19. The non-transitory computer readable memory medium of claim 17, wherein the program portion is further configured to generate the radio frequency pulse sequence to comprise at least one of a half-wave rectified sinusoidal waveform, a block waveform, a Hanning waveform, or a sine-modulated Hanning with frequency modulation, waveform.

20. The non-transitory computer readable memory medium of claim 17, wherein the program portion is further configured to generate a phase of consecutive radio frequency pulse sequences switched between 0° and 180°.

21. The non-transitory computer readable memory medium of claim 17, wherein the program portion is further configured to determine the pseudo-continuous arterial spin labeling pulse sequence based on at least one of a table lookup and equations for setting frequencies of the gradient pulse sequence in accordance with the one or more acoustical resonance frequencies of the magnetic resonance imaging system.

22. The non-transitory computer readable memory medium of claim 17, wherein the program portion is further configured to render the generated image information on a display of the magnetic resonance imaging system.

23. The non-transitory computer readable memory medium of claim 17, wherein the program portion is further configured change a phase of consecutive RF pulse sequences between 0° and 180°.

24. The non-transitory computer readable memory medium of claim 17, wherein the program portion is further configured to select the fixed frequency of the sinusoidal waveform of the gradient pulse sequence so that it is not substantially equal to the determined one or more acoustical resonance frequencies of the magnetic resonance imaging system.

* * * * *